(12) United States Patent
Church

(10) Patent No.: US 6,621,116 B2
(45) Date of Patent: Sep. 16, 2003

(54) ENHANCED EPROM STRUCTURES WITH ACCENTUATED HOT ELECTRON GENERATION REGIONS

(76) Inventor: Michael David Church, 355 Citrus Ave., Sebastian, FL (US) 32958

( * ) Notice: Subject to any disclaimer, the term of this patent is extended or adjusted under 35 U.S.C. 154(b) by 0 days.

(21) Appl. No.: 10/026,345

(22) Filed: Dec. 20, 2001

(65) Prior Publication Data

US 2003/0122177 A1 Jul. 3, 2003

(51) Int. Cl.[7] ................................................ H01L 29/76
(52) U.S. Cl. ....................... 257/314; 257/315; 257/376; 257/392; 257/402; 257/487; 257/327; 257/336; 257/344; 257/394; 257/404; 257/408; 438/217; 438/276; 438/289
(58) Field of Search ................................ 257/314, 315, 257/376, 392, 402, 487, 327, 336, 344, 394, 404, 408; 438/217, 276, 289

(56) References Cited

U.S. PATENT DOCUMENTS

| | | | |
|---|---|---|---|
| 4,970,565 A | 11/1990 | Wu et al. | |
| 5,147,818 A | * 9/1992 | Hikida | 437/57 |
| 5,307,312 A | 4/1994 | Maurelli et al. | |
| 5,457,652 A | 10/1995 | Brahmbhatt | |
| 5,470,771 A | 11/1995 | Fujii et al. | |
| 5,479,367 A | 12/1995 | Maurelli et al. | |
| 5,515,319 A | 5/1996 | Smayling et al. | |
| 5,814,854 A | 9/1998 | Liu et al. | |
| 5,940,324 A | 8/1999 | Chi et al. | |
| 6,025,621 A | 2/2000 | Lee et al. | |
| 6,033,946 A | * 3/2000 | Hutter et al. | 438/202 |
| 6,188,607 B1 | 2/2001 | Chen | |
| 6,232,642 B1 | * 5/2001 | Yamazaki | 257/404 |
| 6,239,472 B1 | * 5/2001 | Shenoy | 257/408 |
| 6,261,886 B1 | 7/2001 | Houston | |
| 6,337,249 B1 | 1/2002 | Yamane et al. | |

* cited by examiner

Primary Examiner—Sara Crane
Assistant Examiner—Junghwa Im
(74) Attorney, Agent, or Firm—Richard K. Robinson

(57) ABSTRACT

An EPROM structure includes a NMOS transistor integrated with a capacitor. The terminal names of the NMOS transistor follow the conventional nomenclature: drain, source, body and gate. The gate of the NMOS transistor is connected directly and exclusively to one of the capacitor plates. In this configuration, the gate is now referred to as the "floating gate". The remaining side of the capacitor is referred to as the "control gate".

5 Claims, 12 Drawing Sheets

ENHANCED EPROM STRUCTURES WITH ACCENTUATED HOT ELECTRON GENERATION REGIONS

BACKGROUND OF THE INVENTION

This invention relates to improved EPROM structures and the method of manufacturing the structures with CMOS and BICMOS technologies that utilize lightly doped drain extensions.

The prior art CMOS and BICMOS device structures often consist of an N type lightly doped drain (Nldd) which is used to grade the drain to body doping. This grading is necessary for reliability purposes. Without the grading, the drain to body electric field is large enough to generate an abundance of hot electrons. Hot electrons eventually lead to threshold voltage shifts, drive current degradation, sub-threshold voltage degradation and transconductance degradation. Any or all of these parametric shifts may be sufficient to lead to circuit failures over the life of the circuit. Hence reliability is compromised.

Attempts have been made to solve this problem. U.S. Pat. No. 4,970,565 dated Nov. 13, 1990, describes a method of building a sealed charged storage structure in a memory cell for an EPROM device which is totally sealed from ultra-violet light by a conductive cover without openings therein for leads to the cell's drain, source and gate. Electrical communication with the source is provided by direct contact with the conductive cover. Access to the drain and floating gate is provided by buried $N^+$ implants, buried $N^+$ layers or N wells crossing underneath the sides of the cover. The memory cell has a single poly floating gate rather than a stacked floating gate/control gate combination. The buried $N^+$ implant or N well serves as the control gate and is capacitively coupled to the floating gate via a thin oxide layer in a coupling area.

U.S. Pat. No. 5,307,312 dated Apr. 26, 1994 describes a process for obtaining an N channel single polysilicon level EPROM cell. The process provides for the simultaneous $N^+$ type implantation of areas of a semiconductor substrate of type P for the formation of a control gate and of highly doped regions of source and drain, defining a channel region. After oxide growth there is executed the deposition and the definition of a polysilicon layer, one region of which constitutes a floating gate above the control gate and the channel region, and partially superimposed over the regions of source and drain.

U.S. Pat. No. 5,470,771 dated Nov. 28, 1995, describes a method of manufacturing a floating gate memory device. A gate oxide film is formed on a surface of a semiconductor substrate. A tunnel insulating film having a thickness smaller than that of the gate insulating film is formed in a portion thereof corresponding to a tunnel region. A first silicon film having a low impurity concentration is formed on the gate insulating film. A second silicon film having an impurity concentration higher than that of the first silicon film is formed on the first silicon film so as to be connected thereto. A third silicon film is formed on the second silicon film through an insulating film. The second and third silicon films are formed into floating and control gates, respectively, thereby forming a semiconductor memory device.

Finally, U.S. Pat. No. 5,479,367 dated Dec. 26, 1995 describes an N channel single polysilicon level EPROM cell. The process provides for the simultaneous $N^+$ type implantation of areas of a semiconductor substrate of type P for the formation of a control gate and of highly doped regions of source and drain, defining a channel region. After oxide growth there is executed the deposition and the definition of a polysilicon layer, one region of which constitutes a floating gate above the control gate and the channel region and partially superimposed over the regions of source and drain.

SUMMARY OF INVENTION

An EPROM structure includes a NMOS transistor integrated with a capacitor. The terminal names of the NMOS transistor follow the conventional nomenclature: drain, source, body and gate. The gate of the NMOS transistor is connected directly and exclusively to one of the capacitor plates. In this configuration, the gate is now referred to as the "floating gate". The remaining side of the capacitor is referred to as the "control gate".

In an unprogrammed state as fabricated, the NMOS transistor has a relatively low threshold voltage (the voltage necessary to turn "on" the transistor), typically less than 1.0 volts when referenced from the floating gate to ground. In the EPROM structure, there is no direct connection to the floating gate, so the threshold voltage must be referenced to the control gate. Because of capacitive voltage dividing, the threshold voltage is somewhat higher, but still typically less than 2.0 volts when referenced to the control gate. Ignoring parasitic capacitances, the relationship of control gate voltage to floating gate voltage is:

$$Vfg = Vcg * C1/(C1+C2)$$

where:
  fg=floating gate
  cg=control gate
  C1=capacitance of the capacitor
  C2=gate capacitance of the NMOS transistor So, with the source and body grounded, the drain biased at some positive voltage (5.0 volts, for example), and the control gate biased greater than the threshold voltage (2.5 volts, for example), the NMOS transistor in an unprogrammed EPROM in the "on" state and drain current flows.

To program the EPROM, the bias conditions are set momentarily so that there is a substantial amount of drain current flowing and hot electrons are generated. Typical bias conditions might be 7.0 volts on the drain and 12.0 volts on the control gate. With these bias conditions, a tremendous amount of hot electrons are generated in a typical 5V, 0.5 micron NMOS transistor. With 12.0 volts on the control gate, there might be 10.0 volts or more across the NMOS gate oxide according to the equation given above. This gate oxide potential "assists" the injection of hot electrons (which already have an abundance of energy) through the gate oxide onto the polysilicon gate. Since the polysilicon gate is a floating gate without connections, these electrons are trapped here due to the oxide insulators which encapsulate the polysilicon once the programming event is completed After ~200 milliseconds (a typical duration of the programming event), the amount of electrons trapped on the floating gate is significant and sufficient to drastically impact the NMOS transistor characteristics. During such programming, it is possible to increase the NMOS transistor threshold voltage to 4.0–10.0 volts. Assuming this new, higher threshold voltage and the same operating bias conditions described above (5.0 volts on the drain and 2.5 volts on the control gate), the NMOS transistor of the EPROM is now in the "off" state (negligible drain current flowing). By selectively programming EPROMs on a circuit depending on the circuit behavior, the circuit can be trimmed or fine-tuned to enhance its performance. It should be noted at this time that 200 milliseconds to program a single EPROM can be very costly. On a complex circuit, it is possible that several programming iterations must be performed for each circuit which can significantly added to the probe/test cost. A faster programming EPROM could reduce probe/test cost significantly.

5V CMOS technologies in the 0.5 micron regime generally utilize NMOS architectures which attempt to control hot electron generation. Most popular is the lightly doped drain (NLdd) combined with spacer technology. These precautions are necessary due to reliability concerns. Over the course of a circuit's active 10 year lifetime, hot electron are continuously being generated at a low level. These hot electrons will degrade the transistor performance (threshold voltage shifts, drive current degradation, sub-threshold slope degradation and transconductance degradation) which can eventually lead to circuit failure. Because of the reliability implications, the NMOS transistor architecture is optimized so that significant hot electron generation is eliminated.

Here is the dilemma: special precautions have been taken to control hot electron generation in the standard NMOS transistor, but excessive hot electron generation is desired in the EPROM's NMOS transistor for fast, reliable programming. An improved EPROM semiconductor structure invention is formed by the addition of a P type region that augments a P well doping under a NMOS transistor gate. This added P region under the gate is formed by an additional photolithography and an additional implantation process steps. Alternatively, this P region could be formed during other processing steps that are already in the process flow for other reasons (an NPN transistor P Base, for example). The addition of this new P region changes the dopant grading of the drain-body junction which allows for an increase in the generation of hot electrons in the EPROM NMOS transistor. Hence, the EPROM can be programmed faster and/or at a lower voltage. Only the NMOS transistor of the EPROM receives the added P region. The standard NMOS transistor in the remainder of the circuitry does not have the P region so its reliability is not compromised.

The new P type regions do not intersect in the center of the NMOS transistor of the EPROM. This ensures that the threshold voltage in the center of an unprogrammed EPROM remains at a low value of less than 2.0 volts. The existence of the P region along the edges of the device will increase the threshold voltage in these regions.

An enhancement to this design provides a better NMOS layout would have the Nldd regions removed along the edges of the transistor, but present in the center of the device. This would ensure an intersection of the new P type region with $N^+$ and the associated high electric field region.

DETAILED DESCRIPTION OF THE EMBODIMENTS

Figure 1:
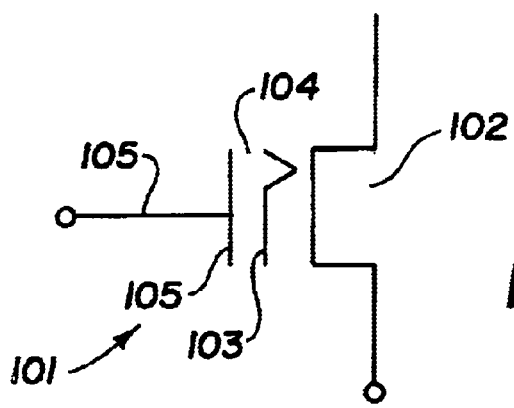
FIG. 1 is a schematic diagram of an EPROM cell (101) according to the invention.

Referring to FIG. 1, there is shown a schematic of an EPROM cell 101 according to the invention. The EPROM cell 101 includes a NMOS transistor 102 integrated with capacitor 104. A control gate 105 is connected directly to one of the plates of a capacitor 104. A floating gate 103 is located between the control gate 105 and the source and drain of transistor 102.

Figure 2:
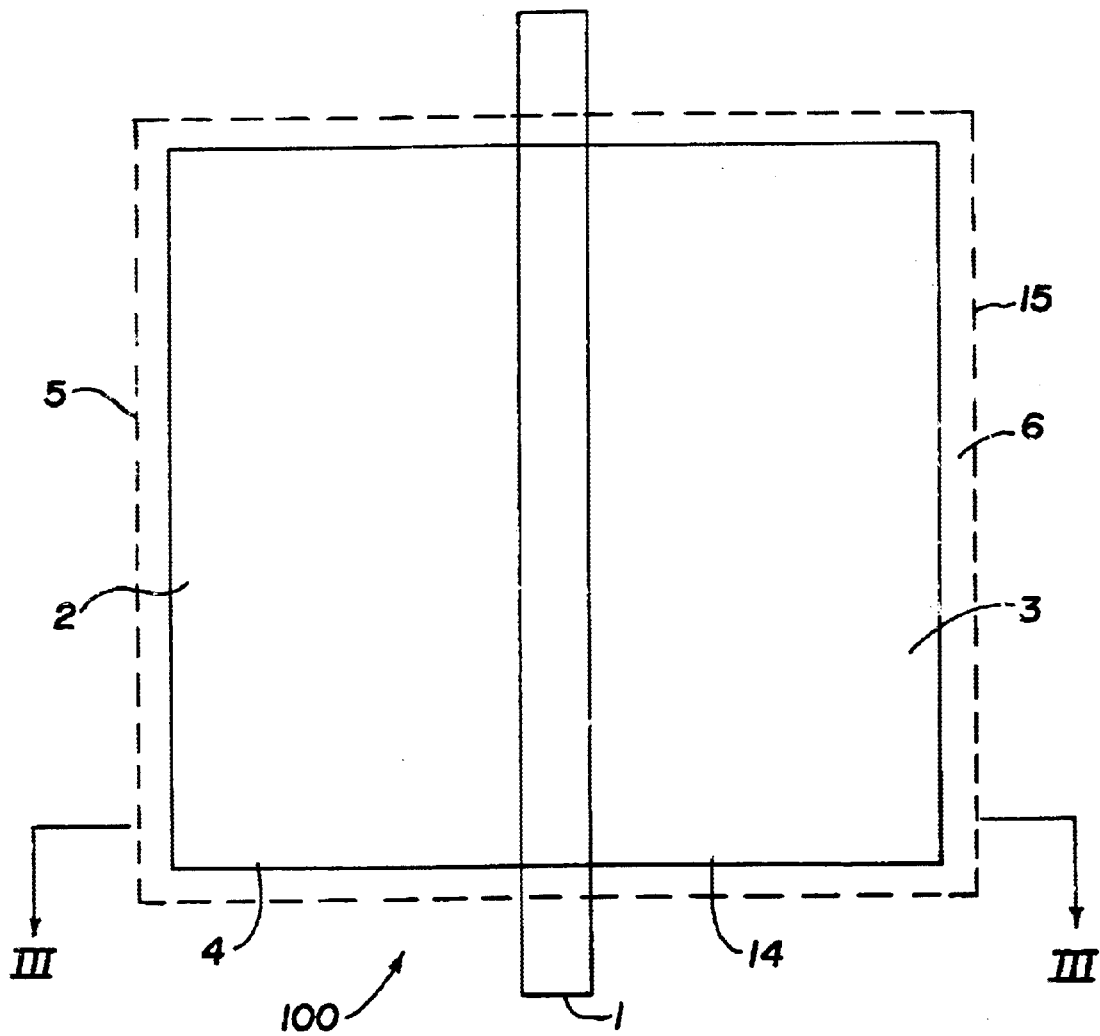
FIG. 2 illustrates a prior art device (100) showing a top view of a lightly doped drain NMOS transistor which is a portion of an EPROM structure.
Figure 3:
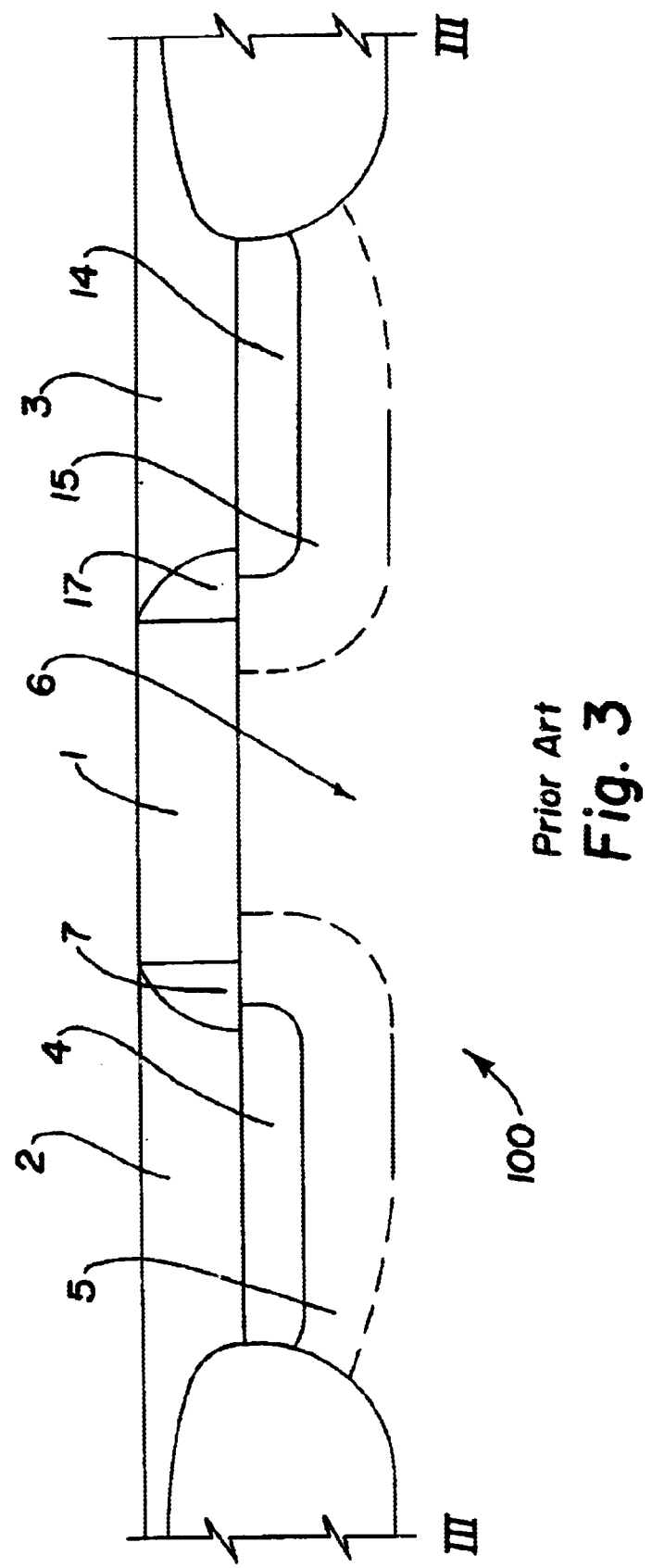
FIG. 3 illustrates a cross section of the prior art device (100) of FIG. 1; as seen from section lines III—III of FIG. 2.

FIGS. 2 and 3 are a top view and a sectional view as seen from lines III—III of a prior art CMOS and BICMOS device structures 100 manufactured on a silicon substrate. The CMOS and BICMOS device structures 100 includes a poly gate 1, a drain 2, and a source 3. The drain 2 and source 3 each include a $N^+$ region 4 and 14 on the surface of a P well 6. Oxide spacers 7 and 17 are located between the source 3 and drain 2 and around the poly gate 1. Dopant grading is provided between the P well 6 and the $N^+$ region 4 and 14 of the source 3 and drain 2 by lightly doped drains (Nldd) 5 and 15.

This grading is necessary for reliability purposes. Without the grading, the drain to body electric field is sufficiently large to generate an abundance of hot electrons. Hot electrons eventually lead to threshold voltage shifts, drive current degradation, sub-threshold voltage degradation and transconductance degradation. Any or all of these parametric shifts may be sufficient to lead to circuit failures over the life of the circuit. Hence reliability is compromised.

An EPROM cell requires hot electron generation for programming but the process technology may utilize lightly doped drains and spacers to minimize hot electron generation. The result is an NMOS transistor 100 cell which cannot be programmed or which requires an inordinate amount of time to program. Complex circuits require a large number of EPROMS and thus a long programming time of 200 ms per EPROM could add a couple of seconds or more to the test time and thus increase the expense considering the millions of circuits which require testing.

Figure 4:
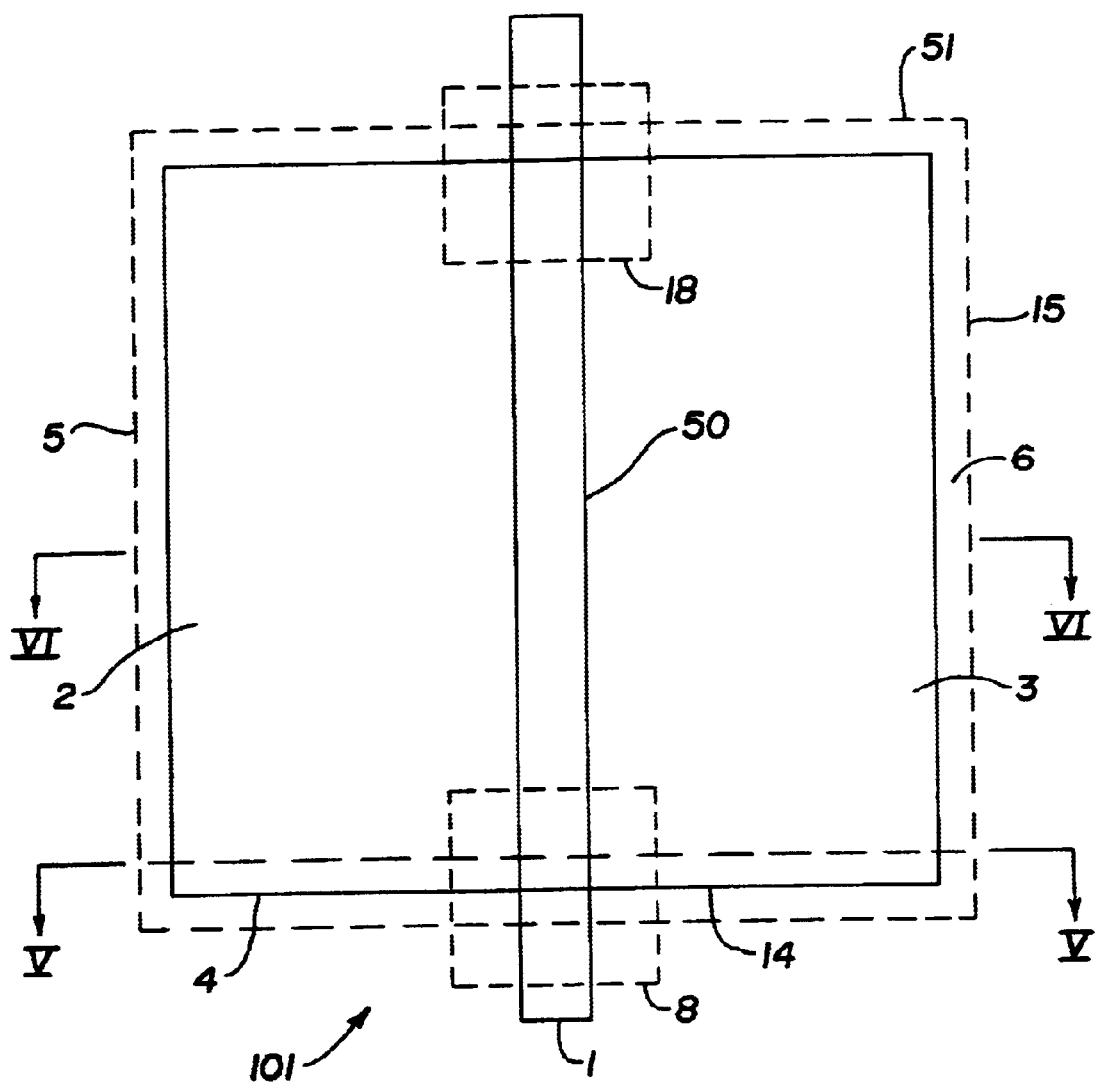
FIG. 4 illustrates a top down view of an NMOS transistor (101) according to the invention.

Referring to FIG. 4, there is illustrated a top down view of an NMOS transistor 101 suitable for use as an EPROM cell according to the invention. The NMOS transistor 101 includes a drain 2 and a source 3 of a $N^+$ regions 4 and 14. Additionally, there is a poly gate 1 with a P well 6 located beneath the poly gate 1 and the $N^+$ regions 4 and 14. Lightly doped drain (Nldd) regions 5 and 15 are located beneath the $N^+$ regions 4 and 14 and extends into the channel region under the poly gate 1. Oxide spacers 7 and 17 are located on the top surface of the substrate adjacent to the poly gate 1 and are used during the implanting of the $N^+$ region 4 and 14 as a masked for the drain 2 and source 3. Novel P regions 8 and 18 are located beneath the poly gate 1 and separated from the $N^+$ regions 4 and 14 by the Nldd regions 5 and 15, respectively. The P regions 8 and 18 extend into the P well 6 from the outer periphery 51 but are not present in the center 50 of the NMOS transistor 101. In a pure CMOS process flow, the new P regions 8 and 18 and the P well 6 are positioned prior to the poly gate 1 formation.

The P regions 8 and 18 may or may not be completely counter dope to the Nldd region 5 and 15 and may or may not actually intersect with the N⁺ regions 4 and 14. The purpose of the P regions 8 and 18 is to increase the electric field between the N⁺ region 4 and P well 6. This increase in the electric field will increase the hot electron generation rate in programming an EPROM cell and thus will enable the NMOS transistor 101 to be programmed quicker and possibly at a lower voltage than the prior art devices.

It should be noted that the N⁺ regions 4 and 14 are completely contained within Nldd regions 5 and 15.

Figure 5:
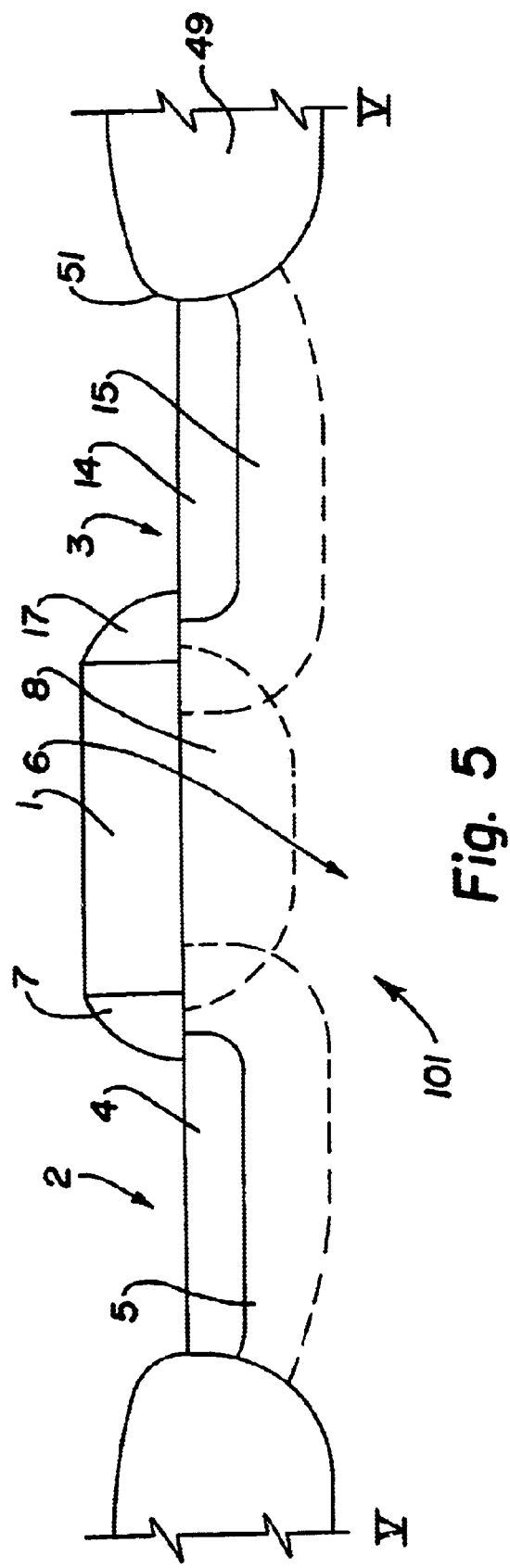
FIG. 5 illustrates a cross section of the NMOS transistor (101) of FIG. 4; as seen from section lines V—V of FIG. 4.

In FIG. 5 there is illustrated a sectional view of the NMOS transistor 101 as seen from section lines V—V of FIG. 4 and suitable for use as an EPROM cell according to the invention. This embodiment solves the above described disadvantage of the prior art devices. The NMOS transistor 101 cell includes the body P well 6, on which there is the poly gate 1, drain 2, and source 3. The oxide spacers 7 and 17 are on the sides of the poly gate 1 which is over the channel that is bounded by the N⁺ regions 4 on one side and 14 on the other side. Located beneath the N⁺ regions 4 and 14 are the Nldd regions 5 and 15 with Nldd region 5 being completely under the N⁺ region 4 and Nldd region 15 being completely under the N⁺ region 14. Both N⁺ regions 4 and 14 are not connected to the poly gate 1 in the channel region and are connected to a LOCOS region 49 that establishes the outer periphery 51. The additional P regions 8 and 18 are present in the channel region beneath the poly gate 1 and connected to the Nldd regions 5 and 15. Not shown is a thin oxide layer that separates the poly gate 1 from the channel and the Nldd regions 5 and 15.

Here again FIG. 5 illustrates the sectional view of the device of FIG. 4 as seen from the section lines V—V of FIG. 5. Because regions 8 and 18 are only located at the edges of the structure, a view through section lines VI—VI through the device center would appear identical to FIG. 3.

Figure 6:
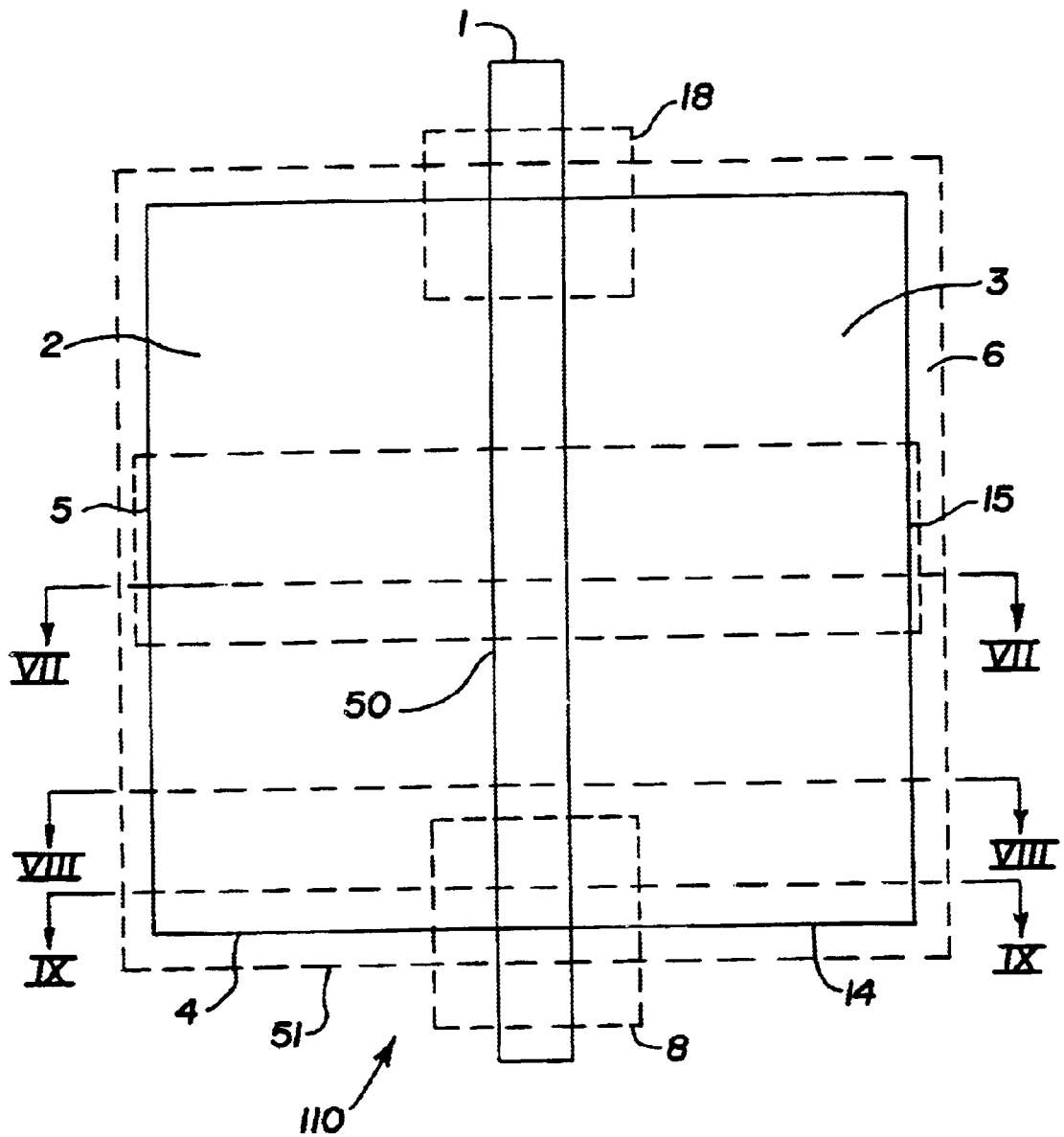
FIG. 6 is a top view of an alternative embodiment of the invention (110).

Referring to FIG. 6, there is shown a top view of NMOS transistor 110 which is an alternate embodiment of the invention and is suitable for use as an EPROM cell. As in the embodiment of FIGS. 4, this embodiment includes drain 2 source 3 and poly gate 1. However, the Nldd regions 5 and 15 are removed from along the edges of the NMOS transistor 101 except in the center of the device. This arrangement insures the intersection of the P regions 8 and 18 with the N⁺ regions 4 and 14 because of the associated high electric field, it is important that the P regions 8 and 18 intersect with the N⁺ drain regions 4 and 14. However, using this alternate approach enables the P regions 8 and 18 to only be included as a design choice. In the embodiment of FIG. 6, the N⁺ regions 4 and 14 are not completely contained within Nldd regions 5 and 15. Each of the Nldd regions 5 and 15 extend from the left and right edges of the active area towards the center of the poly gate 1.

Figure 7:
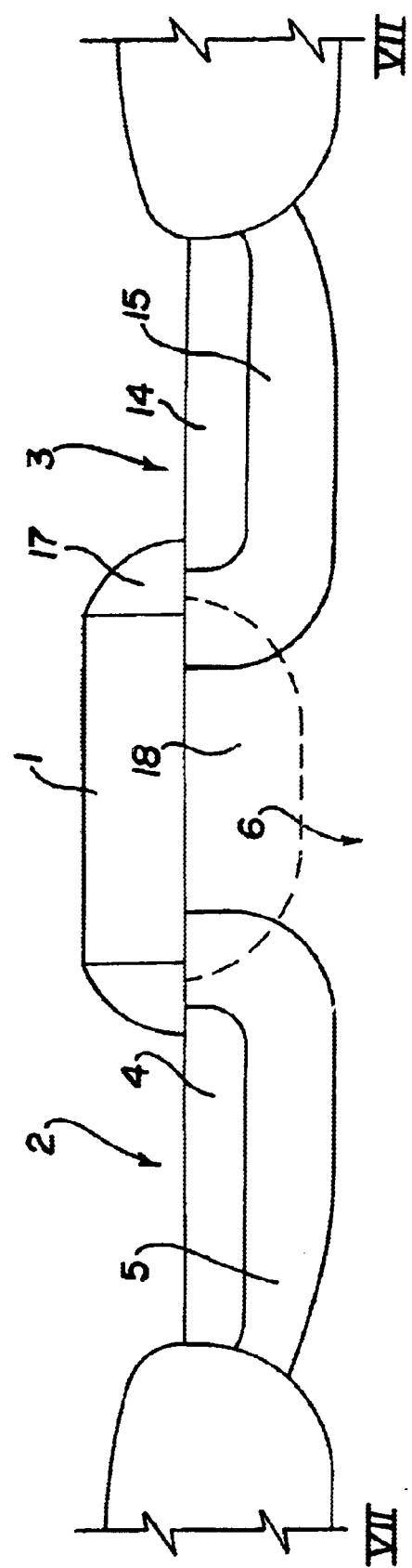
FIGS. 7, 8 and 9 illustrate cross sectional views VII, VIII, and IX respectively of FIG. 6.

FIG. 7 is a sectional view of the device 110 as seen from the sectional lines VII—VII of FIG. 6. This sectional view shows the P regions 8 or 18 as hidden lines and thus resembles the prior art device shown in FIG. 2.

Figure 8:
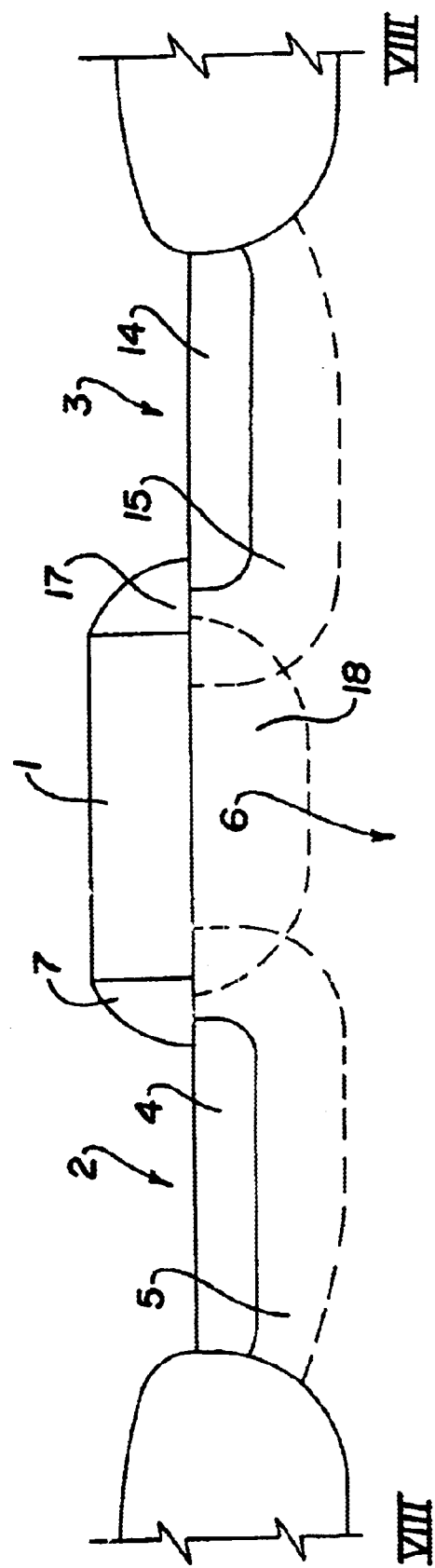

FIG. 8 is a sectional view of the device 110 as seen from section lines VIII—VIII of FIG. 6. As can be seen from the figure, the Nldd regions 5 and 15 are not presented at this position on the cell 110.

Figure 9:
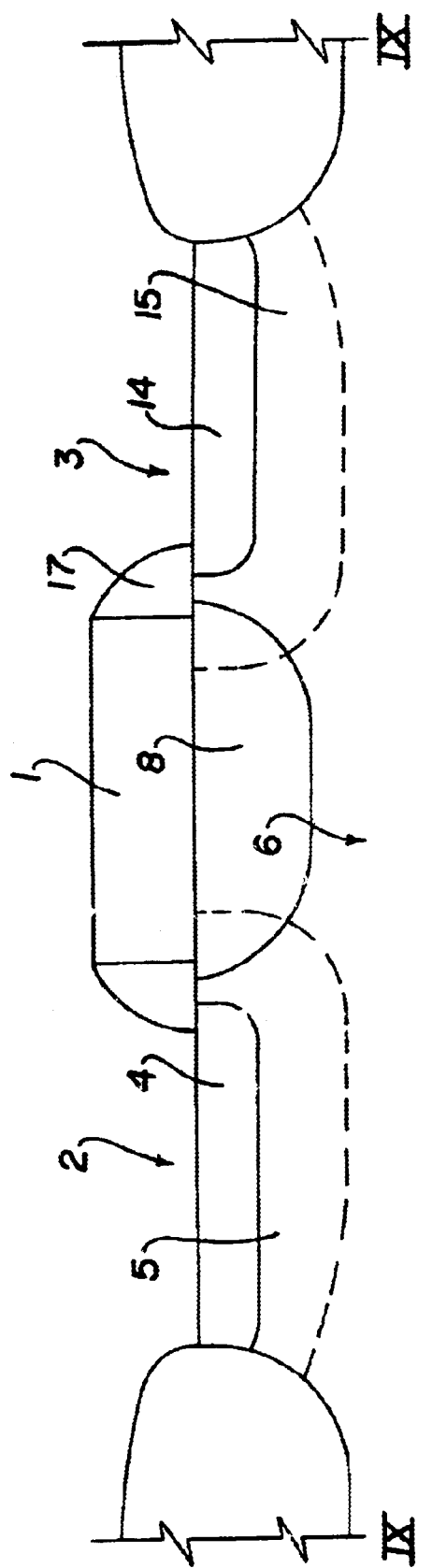

FIG. 9 is a sectional view of the EPROM cell 110 as seen from the sectional lines IX—IX of FIG. 6. As seen from the figures, the P region 8 is visible but the Nldd regions 5 and 15 are not presented at the section position.

FIGS. 10a–10i provides an abbreviated process flow diagram sufficient to enable one skilled in the art to practice the invention without undue experimentation. Additionally, Table 1 provides a more detailed description of the process flow necessary to fabricate the invention.

Figure 10A:
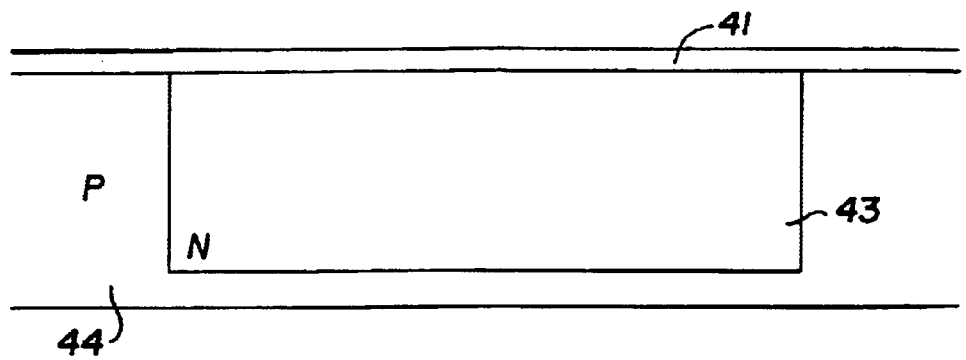
FIGS. 10a–10i illustrate the steps used to fabricate an improved EPROM semiconductor structure by the addition of a P type region that augments the P well doping under the NMOS device gate.

Beginning with FIG. 10a, the process for the disclosed embodiments starts with an N type tub 43 that is pattern by a first reticle being implanted into the P type substrate 44. A thin oxide layer 41 is then created at least on top of the N type tub 43. The N tub 43 is not necessary with an N⁺ wafer and an N⁻ epitaxial layer.

Figure 10B:

In FIG. 10b, the growth of an epitaxial silicon layer 45 can be performed by the growing of the N type epitaxial silicon layer 45.

Figure 10C:
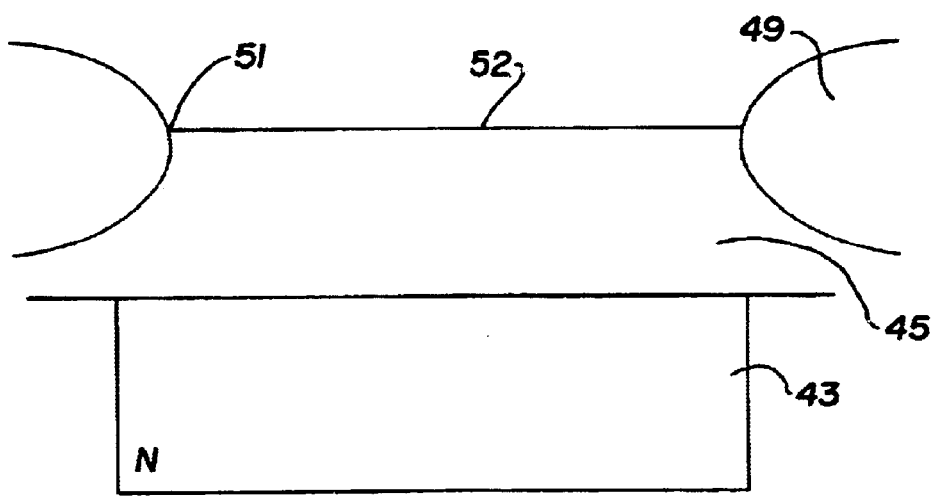

In FIG. 10c, following the growth of the epitaxial layer 45, an active area 52 is masked and an LOCOS operation is performed leaving a LOCOS oxide layer 49 around the mask that establishes an active area 52 having the outer periphery 51.

Figure 10D:
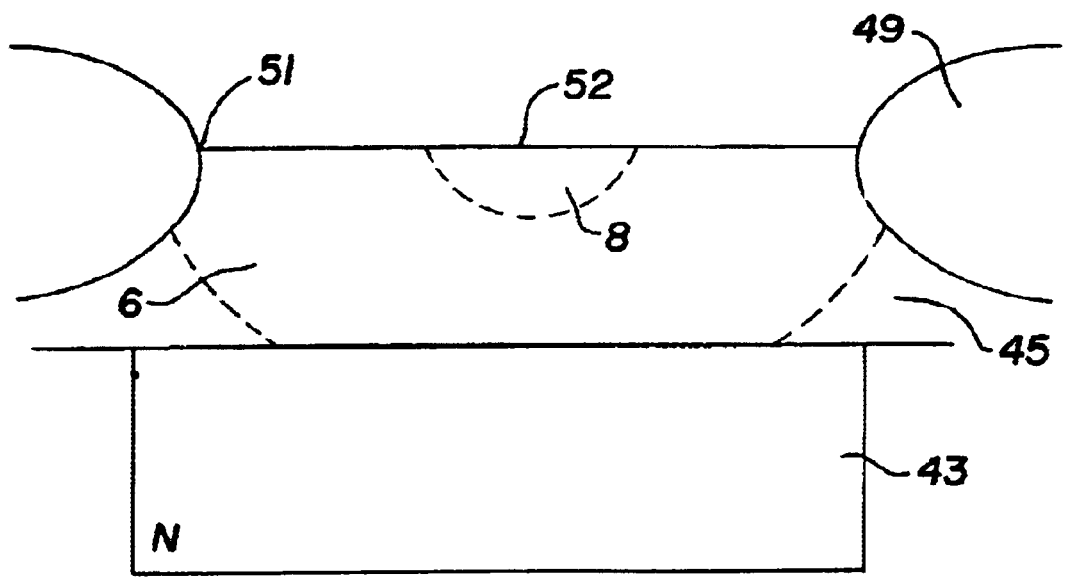

In FIG. 10d, after preparation of the active area 52 using techniques known to those skilled in the art and using a second reticle, a P well 6 having a junction depth of approximately 1 micron, is implanted into the N type epitaxial layer 45 with a peak doping of approximately $3.0 \times 10^{17}/cm^3$. P base regions 8 and 18, novel to the invention, are then implanted into the P well 6 using a third reticle at a junction depth approximately 0.60 microns and a peak doping of approximately $1.0 \times 10^{18}/cm^3$. The term "P base" is used to denote the step in which on different parts of the semiconductor chip of the disclosed embodiment, the P base of an NPN transistor is simultaneously being fabricated. If no such P base operation exists in the process, extra dedicated operations could be added to the flow process to create regions 8 and 18.

Figure 10E:
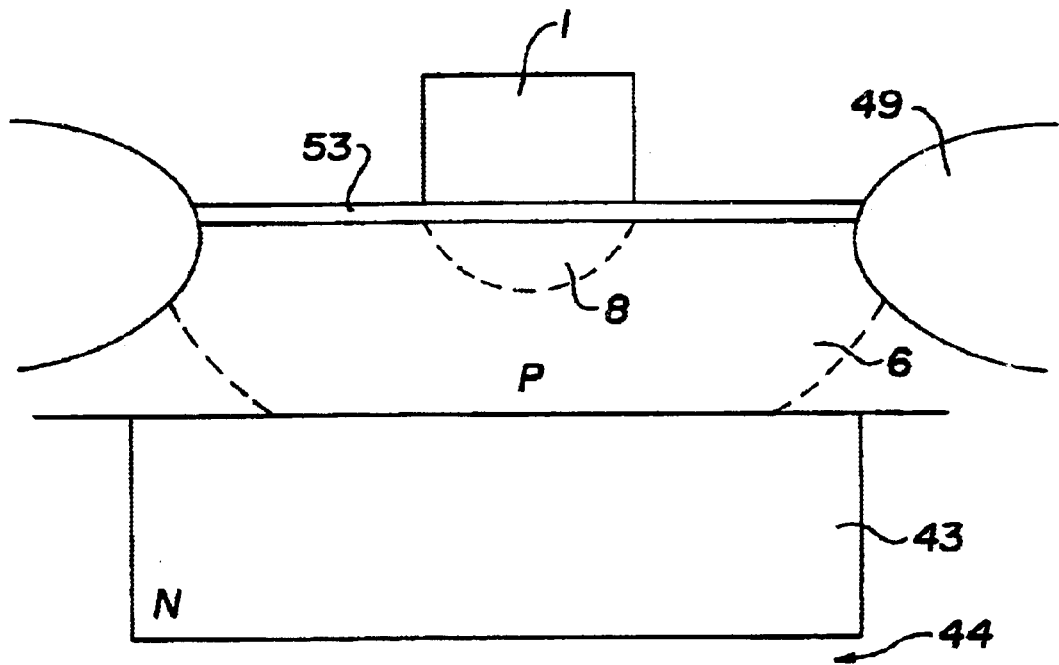
Figure 10F:
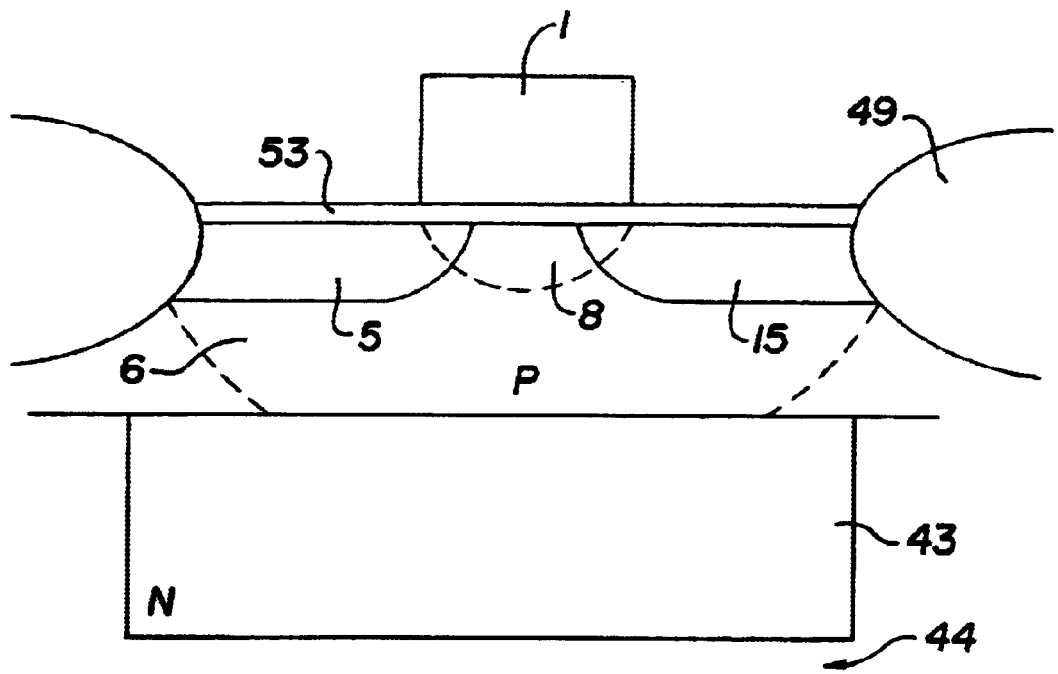

In FIG. 10e, the results of the steps used to create the poly gate 1 is disclosed. The steps include growing the gate oxide 53, depositing a layer of polysilicon. After which there is an N⁺ doping performed unpatterned polysilicons. The layer of polysilicon is masked and etched to create the poly gate 1. Then, using the pattern left by the second reticle and the poly gate 1 to define the Nldd regions 5 and 15 there is performed an Nldd implant at a junction depth of approximately 0.25 microns and a peak doping of approximately $3.0 \times 10^{18}/cm^3$ as shown is FIG. 10f.

Figure 10G:
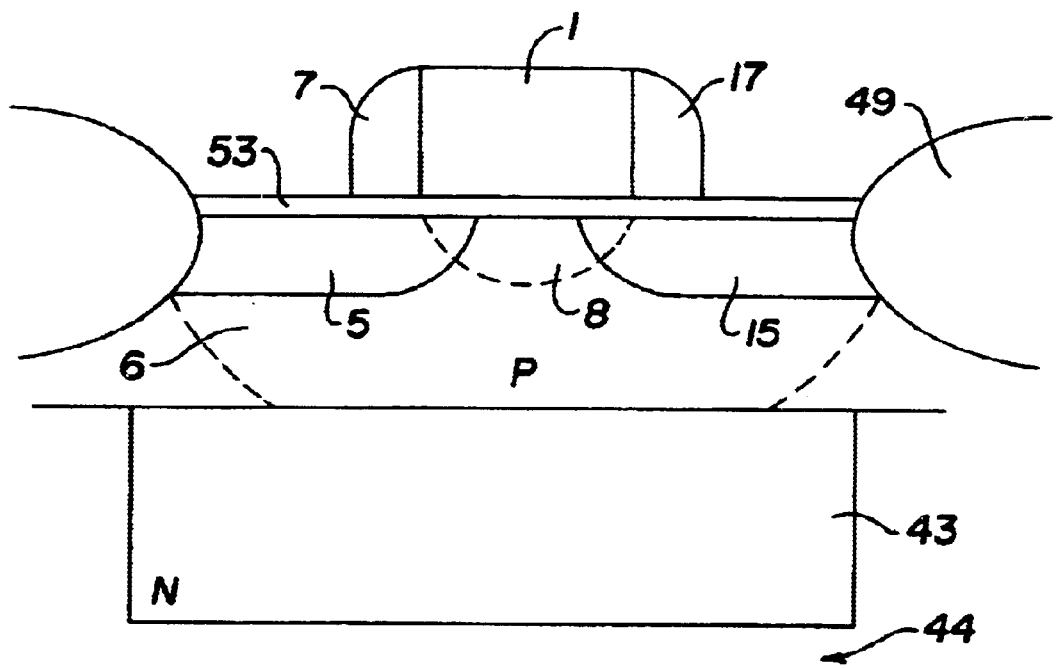

In FIG. 10g, the oxide is deposited and etched to form the oxide spaces 7 and 17.

Figure 10H:
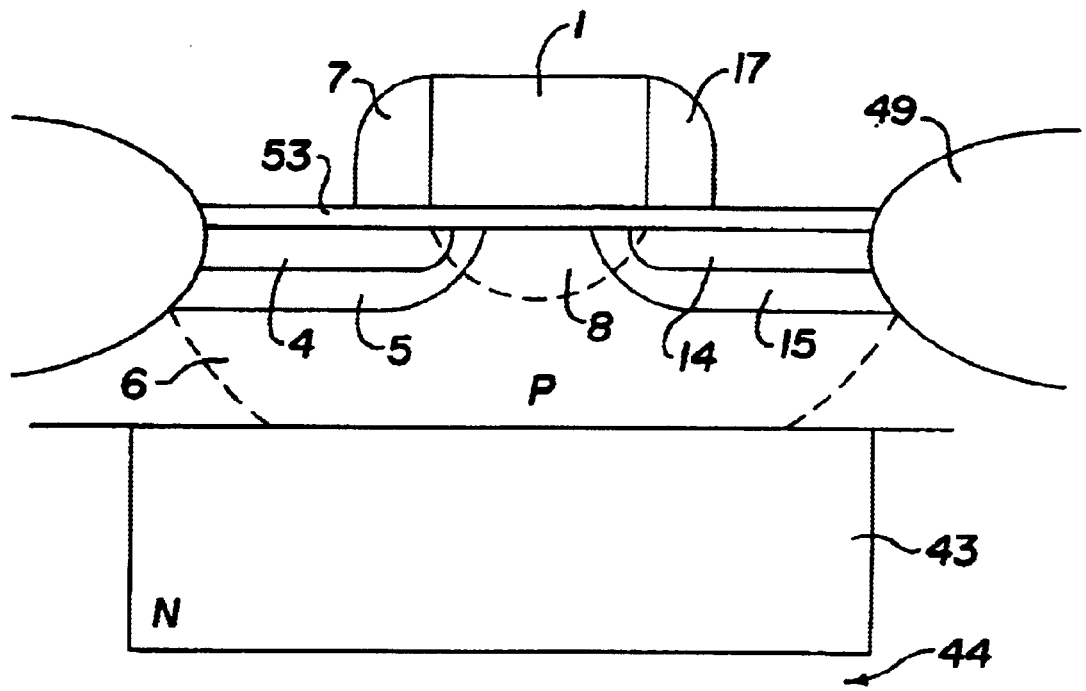

In FIG. 10h, using the pattern left by the second reticle and the oxide spacers and the same reticle used for the Nldd implants, N⁺ regions 4 and 14 are implanted at a junction depth of approximately 0.2 microns and a peak doping of approximately $1.5 \times 10^{20}/cm^3$ between the LOCOS area and the oxide spaces 7 and 17.

Figure 10I:
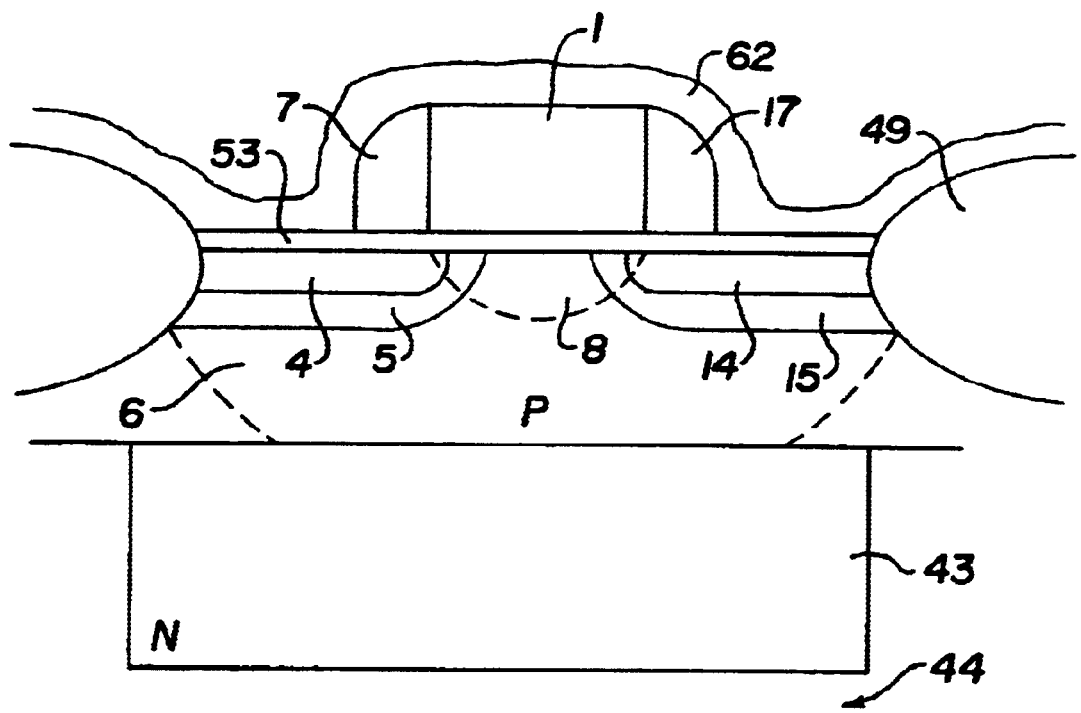

Finally, in FIG. 10i, the circuit is completed according to common practices in the art including adding passivation layer 62, metal connection, etc.

TABLE 1

| Step | Parameters |
|---|---|
| P Substrate | |
| Initial Oxidation | 5300 A |
| N Tub PR/Etch/Implant | (optional) |
| N Tub Drive | |
| Oxide Strip | |
| Epi | 3.1–3.6 um |
| Pad Oxidation | 250 A |
| Nitride Deposition | 1550 A |
| Nitride PR/Etch | |
| Isolation Oxidation | 6000 A |

TABLE 1-continued

| Step | Parameters |
|---|---|
| Nitride Strip/Pad Oxide Strip | |
| Sacrificial Oxidation | 300 A |
| P Well PR/Implant | $B_{11}$, $4.0 \times 10^{12}/cm^2$, 30 KeV & $B_{11}$, $1.2 \times 10^{13}/cm^2$, 284 KeV |
| P Base PR/Implant | $B_{11}$, $3.0 \times 10^{13}/cm^2$, 50 KeV |
| Sacrificial Oxidation Strip | 9:1 BHF 45 secs |
| Gate Oxidation | 140 A |
| Poly Deposition/Dope | |
| Poly PR/Etch | |
| Poly Oxidation | 50 A |
| N Ldd PR/Implant | $P_{31}$, $4.0 \times 10^{13}/cm^2$, 80 KeV |
| Oxide Spacer Deposition | 2000 A |
| Oxide Spacer Etch | |
| Screen Deposition | 225 A |
| N PR/Implant | $As_{75}$, $2.0 \times 10^{15}/cm^2$, 120 KeV |
| S/D RTA | |
| Screen Etch | |
| Platinum Sputter/Sinter/Strip | |
| Field Dep/Planarization | |
| Contacts PR/Etch | |
| Triple Level Metal | |

I claim:

1. An EPROM cell comprising:

a P-type semiconductor substrate having a P well located therein to form a surface active area having a predefined periphery, the active area includes;

at least a first P base region located at the predefined periphery at a surface of the substrate;

a poly gate region located across the surface active area and extending over the at least first P base region;

lightly doped first and second regions aligned with the poly gate region;

oxide spacers at the sides of the poly gate region above portions of the lightly doped first and second regions; and, heavily doped source and drain regions provided at the surface active area with the source region being over at least a portion of the lightly doped first region and in alignment with a first one of the oxide spacers and the drain region being over at least a portion of the lightly doped second region and in alignment with a second one of the oxide spacers, the source and drain regions being separated by a channel region located beneath the poly gate;

a second P base region located at a portion of the predefined periphery opposite the location of the first P base region and the poly gate including a first end over the first P base region and a second end over the second P base region; and the lightly doped first region being positioned at the predefined periphery at a first location and extending towards the center region from the predefined periphery and being position not to contact either the first P base or second P base regions and lightly doped second region being positioned at the predefined periphery at a second location opposite from the first location and extending towards the center region from the predefined periphery and being position not to contact either first or second P base regions.

2. A non-volatile memory cell comprising:

a P type semiconductor substrate;

an N type tub located with the P type semiconductor substrate;

an active region having a predefined periphery with a center on a surface of the P type semiconductor substrate formed by a P well extending from the surface into the N type tube;

at least a first P base region extending from a first position on the predefined periphery towards the center, the first P base region having a predefined width;

heavily doped source and drain regions extending from a surface of the substrate into the P well, and a channel region being defined by a separation between the source and drain regions of a first width and wherein the first width is less than the predefined width and the P base region extends across the channel region;

lightly doped first and second regions extending into the channel region;

a gate oxide layer overlying the channel region;

a poly gate layer overlying the gate oxide layer, and extending over the channel region and over a portion of the first and second regions;

wherein the heavily doped source and drain regions being located within the first and second regions, with the heavily doped source region being located completely within the first region and heavily doped drain region being located completely within the second region, a second P base region located at a portion of the predefined periphery opposite the. location of the first P base region and the poly gate including a first end over the first P base region and a second end over the second P base region; and the source region not being in contact with either the first or second P base regions and the drain region not being in contact with either the first or second P base regions.

3. The non-volatile memory cell according to claim 2, further comprising oxide spacers at the sides of the poly gate layer and overlying a portion of the source and drain regions.

4. The non-volatile memory cell according to claim 2, wherein the lightly doped first and second regions are formed by ion implantation.

5. The non-volatile memory cell according to claim 2, further comprising:

the lightly doped first region being in contact with the first P base region and lightly doped second region being in contact with the second P base region.

* * * * *